(12) United States Patent
Broyde et al.

(10) Patent No.: US 7,952,429 B2
(45) Date of Patent: May 31, 2011

(54) MULTIPLE-INPUT AND MULTIPLE-OUTPUT AMPLIFIER HAVING PSEUDO-DIFFERENTIAL INPUTS

(75) Inventors: Frederic Broyde, Maule (FR); Evelyne Clavelier, Maule (FR)

(73) Assignee: Excem, Maule (FR)

( * ) Notice: Subject to any disclaimer, the term of this patent is extended or adjusted under 35 U.S.C. 154(b) by 0 days.

(21) Appl. No.: 12/955,381

(22) Filed: Nov. 29, 2010

(65) Prior Publication Data
US 2011/0074502 A1    Mar. 31, 2011

Related U.S. Application Data (63) Continuation of application No. PCT/IB2009/051358, filed on Mar. 31, 2009.

(51) Int. Cl.
*H03F 3/68* (2006.01)
(52) U.S. Cl. .......... 330/84; 330/147; 330/48; 330/124 R
(58) Field of Classification Search .......... 330/147–148, 330/84, 295, 124 R
See application file for complete search history.

(56) References Cited

U.S. PATENT DOCUMENTS

| | | | |
|---|---|---|---|
| 5,304,950 A * | 4/1994 | Martin et al. | 330/308 |
| 6,195,395 B1 | 2/2001 | Frodsham | |
| 7,099,395 B1 | 8/2006 | Sidiropoulos et al. | |

FOREIGN PATENT DOCUMENTS

| | | |
|---|---|---|
| FR | 2896360 | 7/2007 |
| FR | 2902946 | 12/2007 |

OTHER PUBLICATIONS

International Search, Jul. 28, 2009.

* cited by examiner

*Primary Examiner* — Hieu P Nguyen
(74) *Attorney, Agent, or Firm* — Christine H. McCarthy; Barnes & Thornburg LLP (57) ABSTRACT

The invention relates to an amplifier capable of delivering a plurality of output signals, these output signals being controlled by a plurality of input signals. A multiple-input and multiple-output amplifier of the invention comprises a common input terminal, 4 signal input terminals, 4 signal output terminals, a common terminal amplifier, 4 active sub-circuits and a feedback network. Each active sub-circuit has a sub-circuit input terminal connected to one of the signal input terminals, a sub-circuit output terminal connected to one of the signal output terminals and a sub-circuit common terminal. The feedback network has four C terminals and one R terminal. Each of said C terminals of the feedback network is coupled to the sub-circuit common terminal of one of said active sub-circuits. The output terminal of the common terminal amplifier is coupled to said R terminal of the feedback network.

10 Claims, 8 Drawing Sheets

PRIOR ART

MULTIPLE-INPUT AND MULTIPLE-OUTPUT AMPLIFIER HAVING PSEUDO-DIFFERENTIAL INPUTS

CROSS REFERENCE TO RELATED APPLICATIONS

This is a Continuation Application of PCT application PCT/IB2009/051358, filed 31 Mar. 2009, published in English under No. WO 2010/004445, which in turn claims priority to French patent application No. 08/03982 filed 11 Jul. 2008 and entitled "Amplificateur à entrées multiples et sorties multiples ayant des entrées pseudo-différentielles", both of which are incorporated herein by reference.

FIELD OF THE INVENTION

The invention relates to an amplifier capable of delivering a plurality of output signals, these output signals being controlled by a plurality of input signals.

PRIOR ART

Let us use n to denote an integer greater than or equal to 2, and let us consider the problem of designing an amplifier producing n output signals as from n input signals, the amplifier being such that the output signals are each, in a frequency band, a linear combination of the input signals. We wish that these linear combinations are defined by a non-diagonal matrix, that is to say that these linear combinations are not linear combinations comprising only one non zero coefficient, which could be obtained using n single-input and single-output amplifiers. We also wish that these linear combinations are determined by a series-series feedback. The prior art applicable to this type of amplifier comprises:

the invention disclosed in the French patent application number 06/00388 of 17 Jan. 2006 entitled "Amplificateur à entrées multiples et sorties multiples", corresponding to the international application number PCT/IB2006/003950 of 19 Dec. 2006 (WO 2007/083191) entitled "multiple-input and multiple-output amplifier";

the invention disclosed in the French patent application number 06/05633 of 23 Jun. 2006, entitled "Amplificateur à entrées multiples et sorties multiples utilisant l'induction mutuelle dans le réseau de rétroaction", corresponding to the international application number PCT/IB2007/001344 of 26 Apr. 2007 (WO 2008/001168), entitled "multiple-input and multiple-output amplifier using mutual induction in the feedback network".

In these inventions, a feedback network having a terminal connected to the reference terminal, the feedback network also having n other terminals, provides a series-series feedback such that the transfer admittance matrix of the amplifier approximates a given admittance matrix, this given admittance matrix being a non-diagonal and invertible n×n matrix.

A multiple-input and multiple-output amplifier using series-series feedback is usually designated by the abbreviation MIMO-SSFA corresponding to the designation "multiple-input and multiple-output series-series feedback amplifier". More details on the MIMO-SSFA may be found in the paper of F. Broydé and E. Clavelier entitled "MIMO Series-Series Feedback Amplifiers", published in the journal *IEEE Transactions on Circuits and Systems II*, vol. 54, No. 12, pages 1037 to 1041, in December 2007, which shows that a MIMO-SSFA may be used at very high frequencies.

Figure 1:
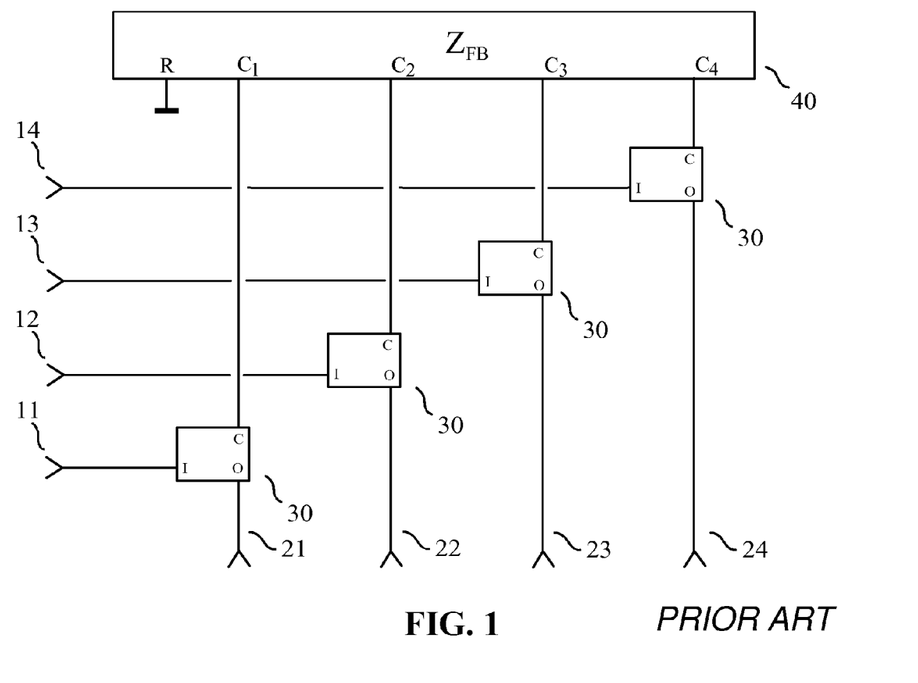
FIG. 1 shows a multiple-input and multiple-output series-series feedback amplifier, and has already been discussed in the section dedicated to the presentation of prior art.
Figure 2:
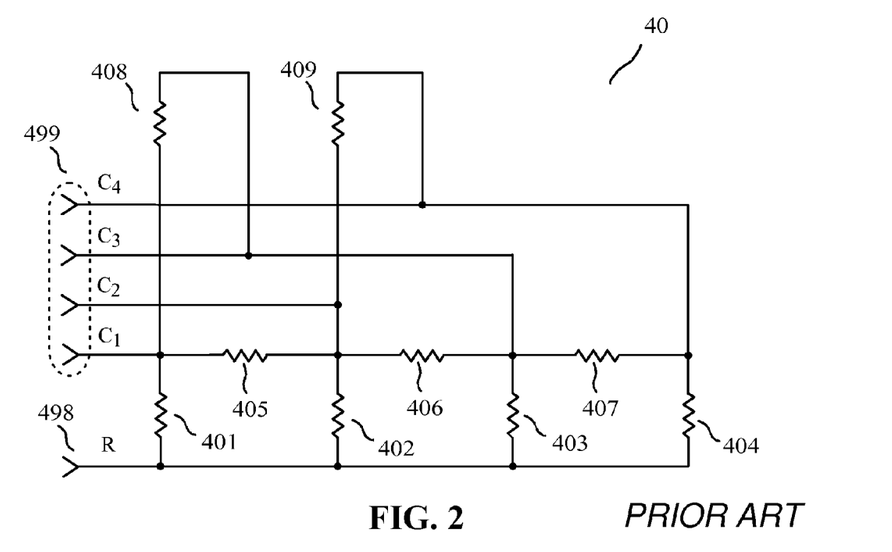
FIG. 2 shows a feedback network for the amplifier of FIG. 1, and has already been discussed in the section dedicated to the presentation of prior art.

For instance, the FIG. 1 shows a multiple-input and multiple-output series-series feedback amplifier described in said French patent application number 06/00388 or in said French patent application number 06/05633 or in the corresponding international applications, comprising n=4 signal input terminals (11) (12) (13) (14), n=4 signal output terminals (21) (22) (23) (24), n=4 active sub-circuits (30) and a feedback network (40). Each active sub-circuit (30) has a sub-circuit input terminal connected to one of the signal input terminals (11) (12) (13) (14), a sub-circuit output terminal connected to one of the signal output terminals (21) (22) (23) (24) and a sub-circuit common terminal. The feedback network (40) has four "C" terminals, each "C" terminal being connected to the sub-circuit common terminal of one of the active sub-circuits (30). The feedback network (40) also has one "R" terminal connected to the reference terminal (represented as the ground symbol). The impedance matrix $Z_{FB}$ of the "C" terminals of the feedback network, with respect to the reference terminal, when said "R" terminal is connected to the reference terminal, is an n×n matrix. This matrix $Z_{FB}$ is non-diagonal and is such that the transfer admittance matrix $Y_T$ of the multiple-input and multiple-output amplifier approximates said given admittance matrix. The schematic diagram of FIG. 2 shows an example of feedback network (40) for the circuit of FIG. 1, made of 9 resistors. This feedback network (40) has one "R" terminal (498) and four "C" terminals (499). Four resistors (401) (402) (403) (404) are connected between one of the "C" terminals (499) and the "R" terminal (498). Five resistors (405) (406) (407) (408) (409) introduce non-diagonal components in the matrix $Z_{FB}$.

For the amplifiers described in said French patent applications number 06/00388, number 06/05633 and in the corresponding international applications, the input signals are the input voltages $v_{Ij}$ between the signal input terminal j and the reference terminal (ground), j being an integer greater than or equal to 1 and less than or equal to n. Consequently, these amplifiers use single-ended inputs. Using n single-ended inputs, each input voltage is applied between a signal input terminal and the reference terminal (ground). This type of input is vulnerable to the noise produced by some unwanted electromagnetic couplings, for instance the couplings related to currents flowing in the ground conductors (this type of coupling is sometimes referred to as "ground noise" or "ground bounce").

However, there are other types of input, intended to provide a good protection against the noise produced by unwanted electromagnetic couplings: differential inputs and pseudo-differential inputs (see for instance the paragraph 4.2.3 of the book of F. Yuan entitled *CMOS current-mode circuits for data communications*, published by Springer in 2007).

A circuit having n differential inputs uses 2 n input terminals. A circuit having n pseudo-differential inputs uses n signal input terminals and one common input terminal distinct from the reference terminal (ground).

Figure 3:
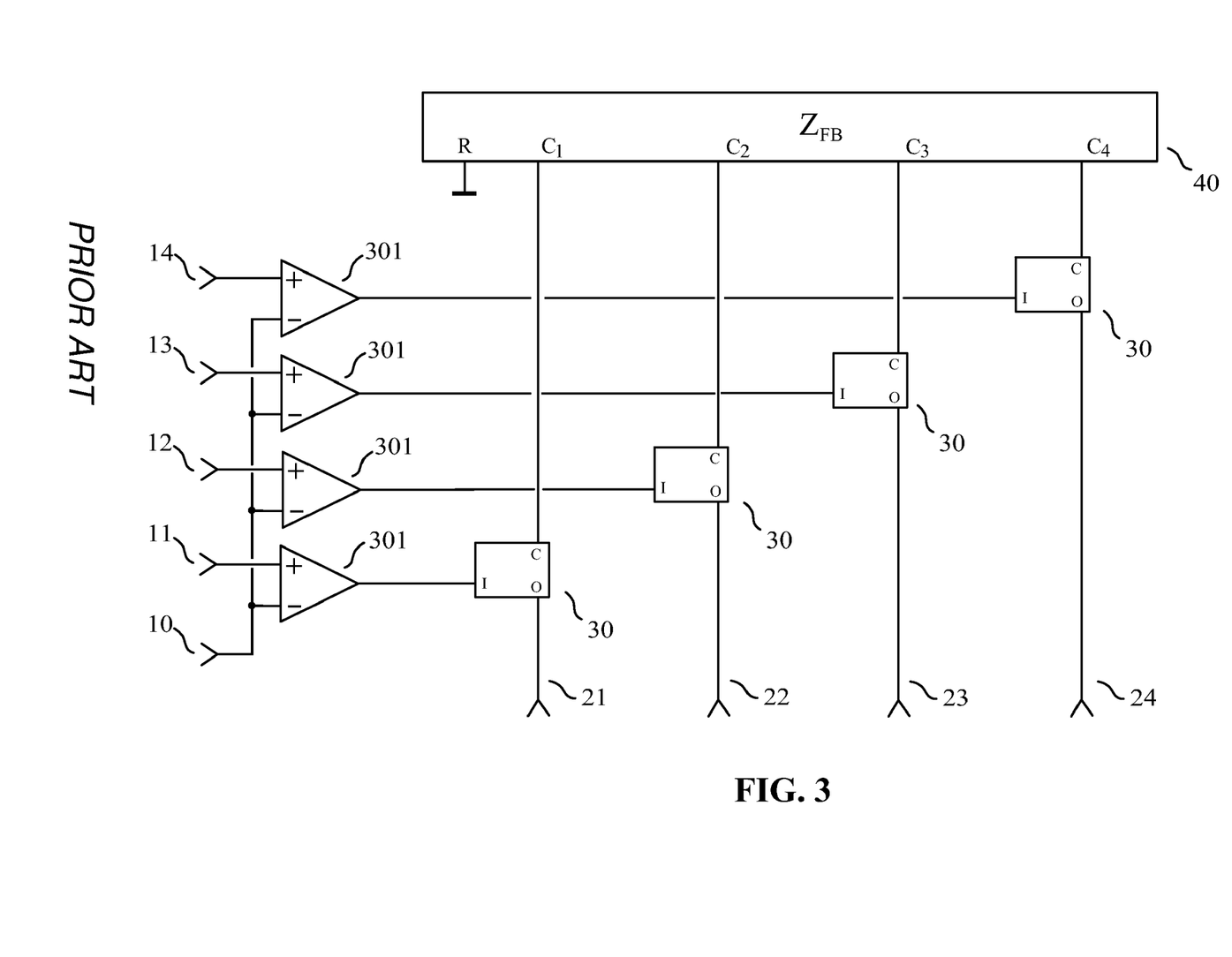
FIG. 3 shows a multiple-input and multiple-output amplifier with pseudo-differential inputs, and has already been discussed in the section dedicated to the presentation of prior art.

The prior art does not disclose any multiple-input and multiple-output series-series feedback amplifier comprising differential inputs. The prior art discloses only one multiple-input and multiple-output series-series feedback amplifier comprising pseudo-differential inputs, in the second embodiment of the French patent application Ser. No. 08/03830 of 7 Jul. 2008, entitled "Circuit de réception pseudo-différentiel", corresponding to the international application number PCT/IB2009/051053 of 13 Mar. 2009, entitled "Pseudo-differential receiving circuit". This multiple-input and multiple-output series-series feedback amplifier comprising pseudo-differential inputs is shown in FIG. 4 of said French patent application number 08/03830 and the corresponding international application. This amplifier, producing n output signals as from n input signals applied to n pseudo-differential inputs, comprises n differential amplifiers and a multiple-input and multiple-output amplifier described in said French patent application number 06/00388 and the corresponding international application, the output terminal of each of said differential amplifiers being connected to one of the signal input terminals of said multiple-input and multiple-output amplifier. For the case n=4, FIG. 3 shows how this solution may be applied to obtain a multiple-input and multiple-output amplifier having pseudo-differential inputs, comprising 4 signal input terminals (11) (12) (13) (14), one common input terminal (10) distinct from the reference terminal, 4 signal output terminals (21) (22) (23) (24), 4 active sub-circuits (30), 4 differential amplifiers (301) and a feedback network (40). This solution leads to a noisy and expensive amplifier, because n differential amplifiers are necessary.

SUMMARY OF THE INVENTION

The purpose of the invention is a multiple-input and multiple-output amplifier having pseudo-differential inputs, which overcomes the limitations of known techniques.

According to the invention, a multiple-input and multiple-output amplifier comprises:
- a common input terminal, n signal input terminals, n signal output terminals and a reference terminal (ground), where n is an integer greater than or equal to 2;
- at least one common terminal amplifier, each of said common terminal amplifiers being an amplifier comprising an input terminal and an output terminal, said input terminal of each of said common terminal amplifiers being coupled to said common input terminal;
- a number n of active sub-circuits, each of said active sub-circuits having a sub-circuit input terminal, a sub-circuit output terminal and a sub-circuit common terminal, the sub-circuit input terminal being coupled to one of said signal input terminals, the sub-circuit output terminal being coupled to one of said signal output terminals, each of said active sub-circuits being such that the current flowing out of the sub-circuit common terminal and the current flowing into the sub-circuit output terminal depend on the voltage between the sub-circuit input terminal and the sub-circuit common terminal, each of said signal input terminals being coupled to only one sub-circuit input terminal, each of said signal output terminals being coupled to only one sub-circuit output terminal;
- a feedback network having a number n of "C" terminals and at least one "R" terminal, each of said "C" terminals being coupled to the sub-circuit common terminal of one of said active sub-circuits, the output terminal of each of said common terminal amplifiers being coupled to one of said "R" terminals, the feedback network being such that, in a known frequency band, the impedance matrix of the "C" terminals of the feedback network with respect to the "R" terminals connected the one to the other is a non-diagonal n×n matrix.

The denominations <<"C" terminal">> and <<"R" terminal">> used above are arbitrary. According to the invention, it is possible that the output terminal of each common terminal amplifier is coupled to a different "R" terminal. In this case, the number r of "R" terminals is necessarily greater than or equal to the number c of common terminal amplifiers, and if r>c, the r–c "R" terminals which are not coupled to the output terminal of one of said common terminal amplifiers may for instance be connected to the reference conductor (ground).

The specialist understands that, as in said French patent applications number 06/00388 and number 06/05633 and the corresponding international applications, the feedback network introduces a series-series feedback for the signals applied to the signal input terminals.

Let us number from 1 to n the signal input terminals of the amplifier of the invention. Let us number the active sub-circuits and the signal output terminals in such a way that, if j is an integer greater than or equal to 1 and less than or equal to n, the sub-circuit input terminal of the active sub-circuit j is coupled to the signal input terminal j, and the sub-circuit output terminal of the active sub-circuit j is coupled to the signal output terminal j.

For any integer j greater than or equal to 1 and less than or equal to n, we define the input current $i_{Ij}$ flowing into the signal input terminal j and the input voltage $v_{Ij}$ between the signal input terminal j and the reference terminal (ground). We also define the input current $i_{In+1}$ flowing into the common input terminal and the input voltage $v_{In+1}$ between the common input terminal and the reference terminal. Let us use $I_I$ to denote the column-vector of the input currents $i_{I1}, \ldots, i_{In+1}$, and $V_I$ to denote the column-vector of the input voltages $v_{I1}, \ldots, v_{In+1}$.

For any integer j greater than or equal to 1 and less than or equal to n, we define the output current $i_{Oj}$ flowing into the signal output terminal j, and the output voltage $v_{Oj}$ between the signal output terminal j and the reference terminal. Let us use $I_O$ to denote the column-vector of the output currents $i_{O1}, \ldots, i_{On}$ and $V_O$ to denote the column-vector of the output voltages $v_{O1}, \ldots, v_{On}$.

If we assume that the amplifier of the invention is linear, it is characterized, in the frequency domain, by the two following equations:

$$I_I = Y_I V_I + Y_R V_O \tag{1}$$

$$I_O = Y_T V_I + Y_O V_O \tag{2}$$

where $Y_I$, $Y_R$, $Y_T$ and $Y_O$ are matrices. All components of these matrices have the dimensions of admittance. Consequently, we will refer to $Y_I$ as the "short-circuit input admittance matrix" of the amplifier, $Y_I$ being a matrix of size (n+1)×(n+1), to $Y_R$ as the "short-circuit reverse transfer admittance matrix" of the amplifier, $Y_R$ being a matrix of size (n+1)×n, to $Y_T$ as the "short-circuit transfer admittance matrix" of the amplifier, $Y_T$ being a matrix of size n×(n+1), and to $Y_O$ as the "short-circuit output admittance matrix" of the amplifier, $Y_O$ being a matrix of size n×n. These four matrices have complex components and may be frequency-dependent.

In the case where an amplifier of the invention does not exactly comply with the equations (1) and (2), the specialists understand that these equations are nevertheless valid for small signals, at a given quiescent operating point, if the noise produced by the amplifier is neglected.

According to the invention, the feedback network produces a negative series-series feedback such that, in said known frequency band, the short-circuit transfer admittance matrix $Y_T$ of the amplifier approximates a given admittance matrix, this given admittance matrix being a matrix of size n×(n+1).

The multiple-input and multiple-output amplifier of the invention behaves as an amplifier having pseudo-differential inputs if and only if the output currents $i_{O1}, \ldots, i_{On}$ are mainly determined by the n input signals $v_{I1}$-$v_{In+1}, \ldots, v_{In}$-$v_{In+1}$, so that the influence of $v_{In+1}$ is negligible when the input signals are kept constant.

Let us use $w_j$ to denote the voltage of the sub-circuit common terminal of the active sub-circuit j with respect to the reference terminal, and W to denote the column-vector of the voltages $w_1, \ldots, w_n$. For a first analysis of the principle of the invention, let us consider, as a non-limiting example, the special case in which, for $1 \leq j \leq n$, we have $$i_{CAj} = y_{CTAj}(v_{Ij} - w_j) \quad (3)$$

and $$i_{OAj} = y_{OTAj}(v_{Ij} - w_j) \quad (4)$$

where:
- $i_{CAj}$ is the current flowing out of the sub-circuit common terminal of the active sub-circuit j,
- $y_{CTAj}$ is the sub-circuit common terminal forward transfer admittance of the active sub-circuit j,
- $i_{OAj}$ is the current flowing into the sub-circuit output terminal of the active sub-circuit j, and
- $y_{OTAj}$ is the sub-circuit output terminal forward transfer admittance of the active sub-circuit j.

This particular case corresponds to a multiple-input and multiple-output amplifier of the invention in which the active sub-circuit j is such that the current flowing out of the sub-circuit common terminal and the current flowing into the sub-circuit output terminal may be considered as only depending on the voltage between the sub-circuit input terminal and the sub-circuit common terminal.

At a given frequency f in said known frequency band, if we only consider the feedback network, used in another circuit in which its "R" terminals are connected to said reference terminal, we can measure the impedance matrix $Z_{FB}$ of the "C" terminals of the feedback network, with respect to said reference terminal. This matrix $Z_{FB}$ is referred to as: the impedance matrix of the "C" terminals of the feedback network with respect to the "R" terminals connected the one to the other. According to the invention, $Z_{FB}$ is a non-diagonal matrix of size n×n. As a non-limiting example, let us assume that:
- the current $i_{CAj}$ flowing out of the sub-circuit common terminal of the active sub-circuit j is substantially equal to the current flowing into the corresponding "C" terminal of the feedback network;
- each "R" terminal is connected to the output terminal of one of said common terminal amplifiers;
- each of said common terminal amplifiers has a small-signal voltage gain equal to 1 and a negligible output impedance.

With these assumptions, we find that:

$$W = Z_{FB} \begin{pmatrix} i_{CA1} \\ \vdots \\ i_{CAn} \end{pmatrix} + \begin{pmatrix} v_{In+1} \\ \vdots \\ v_{In+1} \end{pmatrix} \quad (5)$$

Let us use $\mathrm{diag}_n(y_{CTA1}, \ldots, y_{CTAn})$ to denote the diagonal matrix of the sub-circuit common terminal forward transfer admittances $y_{CTAj}$, and $\mathrm{diag}_n(y_{OTA1}, \ldots, y_{OTAn})$ to denote the diagonal matrix of the sub-circuit output terminal forward transfer admittances $y_{OTAj}$. Using the equations (3) and (5) and assuming that the circuit is stable, we obtain, for the example being considered:

$$W = Z_{FB} \mathrm{diag}_n(y_{CTA1}, \ldots, y_{CTAn}) \left[ \begin{pmatrix} v_{I1} \\ \vdots \\ v_{In} \end{pmatrix} - W \right] + \begin{pmatrix} v_{In+1} \\ \vdots \\ v_{In+1} \end{pmatrix} \quad (6)$$

We then find that, for the example being considered $$\begin{pmatrix} v_{I1} \\ \vdots \\ v_{In} \end{pmatrix} - W = [1_n + Z_{FB} \mathrm{diag}_n(y_{CTA1}, \ldots, y_{CTAn})]^{-1} \begin{pmatrix} v_{I1} - v_{n+1} \\ \vdots \\ v_{In} - v_{n+1} \end{pmatrix} \quad (7)$$

where $1_n$ is the identity matrix of size n×n. Assuming that the current $i_{OAj}$ flowing into the sub-circuit output terminal of the active sub-circuit j is substantially equal to the current $i_{Oj}$ flowing into the signal output terminal j, and using the equation (4), we obtain, for the example being considered $$I_O = \mathrm{diag}_n(y_{OTA1}, \ldots, y_{OTAn})[1_n + Z_{FB} \mathrm{diag}_n(y_{CTA1}, \ldots, y_{CTAn})]^{-1} \quad (8)$$

$$\begin{pmatrix} v_{I1} - v_{In+1} \\ \vdots \\ v_{In} - v_{In+1} \end{pmatrix}$$

If we use the notation $$Y_{TL} = \mathrm{diag}_n(y_{OTA1}, \ldots, y_{OTAn})[1_n + Z_{FB} \mathrm{diag}_n(y_{CTA1}, \ldots, y_{CTAn})]^{-1} \quad (9)$$

we have, for the example being considered $$I_O = Y_{TL} \begin{pmatrix} v_{I1} \\ \vdots \\ v_{In} \end{pmatrix} + Y_{TL} \begin{pmatrix} -1 \\ \vdots \\ -1 \end{pmatrix} v_{In+1} \quad (10)$$

For the example being considered, we therefore conclude that $$Y_T = \left( Y_{TL} \quad Y_{TL} \begin{pmatrix} -1 \\ \vdots \\ -1 \end{pmatrix} \right) \quad (11)$$

and $$Y_O = 0_n \quad (12)$$

where $0_n$ is the null matrix of size n×n. Thus, with our assumptions, we have been able to determine the short-circuit transfer admittance matrix $Y_T$ and the short-circuit output admittance matrix $Y_O$ of the amplifier of the invention. The comparison of the above equation (8) with the equation (8) of said French patent application number 06/00388 and of the corresponding international application shows that an amplifier of the invention may behave like the amplifier shown in FIG. 3, that is to say as an amplifier having pseudo-differential inputs. The output signals produced by the amplifier of the invention are linear combinations of the n input signals $v_{I1} - v_{In+1}, \ldots, v_{In} + v_{In+1}$. Moreover, $Z_{FB}$ being a non-diagonal matrix, the above equation (9) shows that the feedback network is such that, at said given frequency f in said known frequency band, the output signals are not linear combinations of the input signals such that each of said linear combinations comprises only one non zero coefficient, that is to say linear combinations which could be obtained using n single-input and single-output amplifiers.

Consequently, according to the invention, it is possible that, in said known frequency band, each of said common terminal amplifiers has a small-signal voltage gain approximately equal to one.

The equations (9) and (11) show that the feedback network can be used to obtain a negative feedback desensitizing the short-circuit transfer admittance matrix $Y_T$ with respect to variations in the sub-circuit common terminal forward transfer admittances $y_{CTAj}$. The specialist sees that this is a benefit, which is increased when the absolute values of the sub-circuit common terminal forward transfer admittances $y_{CTAj}$ are sufficiently increased. Using the mathematical results presented in paragraph 87 of the book *Algèbre linéaire* of V. Voïévodine, published by Editions Mir in 1976, we note that if the absolute values $|y_{CTAj}|$ of the sub-circuit common terminal forward transfer admittances are much larger than the absolute values of all components of the inverse of the matrix $Z_{FB}$, the following approximation is applicable:

$$(1_n + [Z_{FB} \text{diag}_n(y_{CTA1}, \ldots, y_{CTAn})]^{-1})^{-1} \approx 1_n \quad (13)$$

Consequently, the equation (9) becomes $$Y_{TL} \approx \text{diag}_n\left(\frac{y_{OTA1}}{y_{CTA1}}, \ldots, \frac{y_{OTAn}}{y_{CTAn}}\right) Z_{FB}^{-1} \quad (14)$$

The equation (14) is valid only if the matrix $Z_{FB}$ is invertible. Consequently, according to the invention, it is possible that the impedance matrix $Z_{FB}$ of the "C" terminals of the feedback network with respect to the "R" terminals connected the one to the other is, in said known frequency band, an invertible matrix.

As shown in the French patent application number 06/00388 and in the corresponding international application, the specialists know several designs appropriate for the active sub-circuits, which provide ratios $y_{OTAj}/y_{CTAj}$ close to 1 or to −1. In this case, with the assumptions detailed above, the negative feedback produced by the feedback network is such that the short-circuit transfer admittance matrix $Y_T$ is practically independent from the exact value of the sub-circuit common terminal forward transfer admittances $y_{CTAj}$.

Consequently, according to the invention, if the matrix $Z_{FB}$ is invertible, the multiple-input and multiple-output amplifier may be such that, in said known frequency band, each of said active sub-circuits has an absolute value $|y_{CTAj}|$ of the ratio of the current flowing out of the sub-circuit common terminal to the voltage between the sub-circuit input terminal and the sub-circuit common terminal much larger than the absolute values of all components of the inverse of the impedance matrix $Z_{FB}$ of the "C" terminals of the feedback network with respect to the "R" terminals connected the one to the other.

In the same way as for the devices described in said French patent applications number 06/00388 and number 06/05633 and the corresponding international applications, according to the invention, said feedback network may be composed of linear, passive and reciprocal circuit elements. By way of example, the feedback network may comprise resistors and/or capacitors and/or windings providing inductance. By way of example it is possible that the feedback network comprises two or more windings arranged in such a way that, in at least a part of said known frequency band, a non-negligible mutual induction appears between these windings. In this case, two or more such windings may for instance be:

windings of the same transformer (such a transformer may comprise, or not, a magnetic circuit);

windings made of printed circuit board traces, with or without magnetic circuit;

windings built in an integrated circuit.

Said feedback network may also comprise one or more active components, for instance one or more insulated-gate field-effect transistors (MOSFETs). Such components may be adjustable by electrical means, such as a MOSFET used in the ohmic regime providing a variable resistance, or such as a variable capacitance diode providing a variable capacitance. Consequently, according to the invention, said feedback network may be such that the impedance matrix $Z_{FB}$ of the "C" terminals of the feedback network with respect to the "R" terminals connected the one to the other can be adjusted by electrical means.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 4:
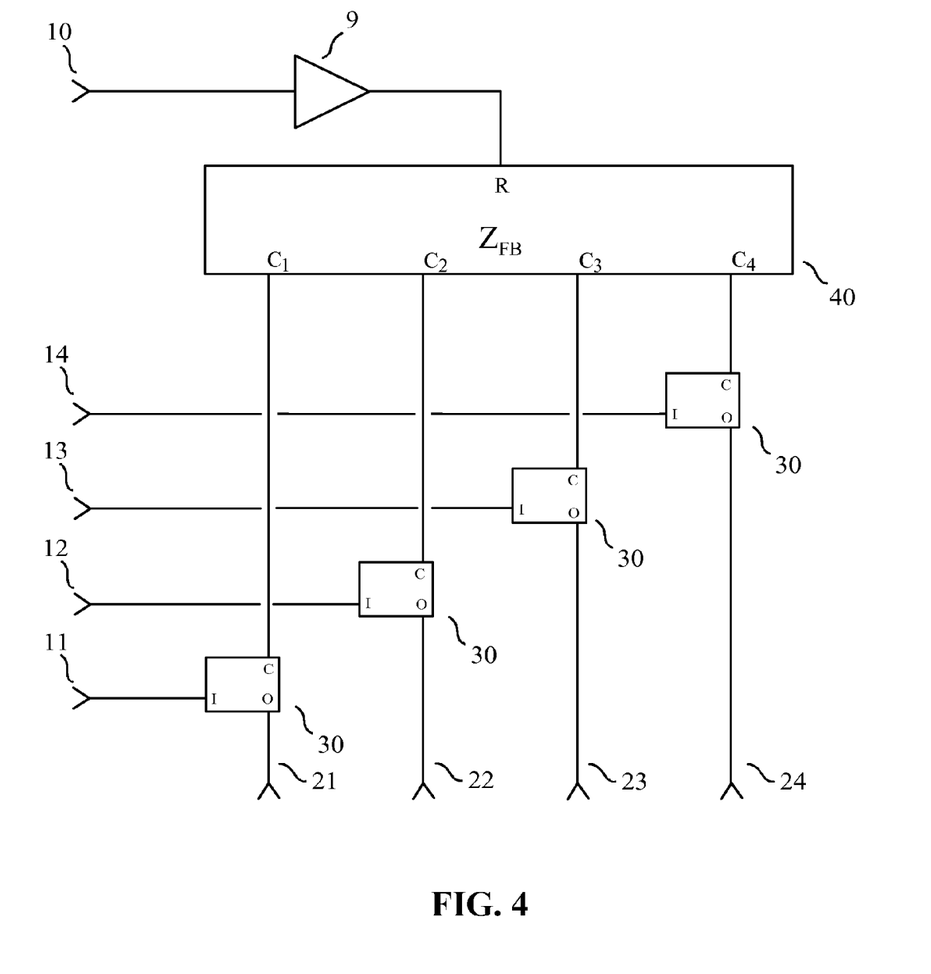
FIG. 4 shows a first embodiment of the invention, for n=4.

As a first embodiment of a device of the invention, given by way of non-limiting example, we have represented in FIG. 4 a "multiple-input and multiple-output amplifier having pseudo-differential inputs" of the invention, comprising a common input terminal (10), n=4 signal input terminals (11) (12) (13) (14), n=4 signal output terminals (21) (22) (23) (24), a common terminal amplifier (9), 4 active sub-circuits (30) and a feedback network (40). Each active sub-circuit (30) has a sub-circuit input terminal connected to one of the signal input terminals (11) (12) (13) (14), a sub-circuit output terminal connected to one of the signal output terminals (21) (22) (23) (24), and a sub-circuit common terminal. Each active sub-circuit (30) is such that the current flowing out of the sub-circuit common terminal and the current flowing into the sub-circuit output terminal depend on the voltage between the sub-circuit input terminal and the sub-circuit common terminal. The feedback network (40) has n=4 "C" terminals and one "R" terminal. Said "C" terminals are referred to as $C_1, C_2, C_3$ and $C_4$. Each of said "C" terminals of the feedback network (40) is coupled to the sub-circuit common terminal of one of said active sub-circuits (30). The output terminal of the common terminal amplifier (9) is coupled to said "R" terminal of the feedback network (40). The input terminal of the common terminal amplifier (9) is coupled to said common input terminal (10).

Let us consider another circuit in which said "R" terminal of the feedback network (40) would be connected to the reference terminal. The feedback network (40) is such that, in this other circuit, the impedance matrix of the "C" terminals of the feedback network (40) with respect to the reference terminal is defined, in a known frequency band. This matrix is the above-defined impedance matrix $Z_{FB}$ of the "C" terminals of the feedback network with respect to the "R" terminals connected the one to the other, which is a matrix of size n×n. Moreover, the feedback network (40) is such that, at any frequency in said known frequency band, $Z_{FB}$ is a non-diagonal matrix. Consequently, the specialist understands that, in said known frequency band, the output signals are not linear combinations of the input signals such that each of said linear combinations comprises only one non zero coefficient, that is to say linear combinations which could be obtained using n single-input and single-output amplifiers.

Figure 5:
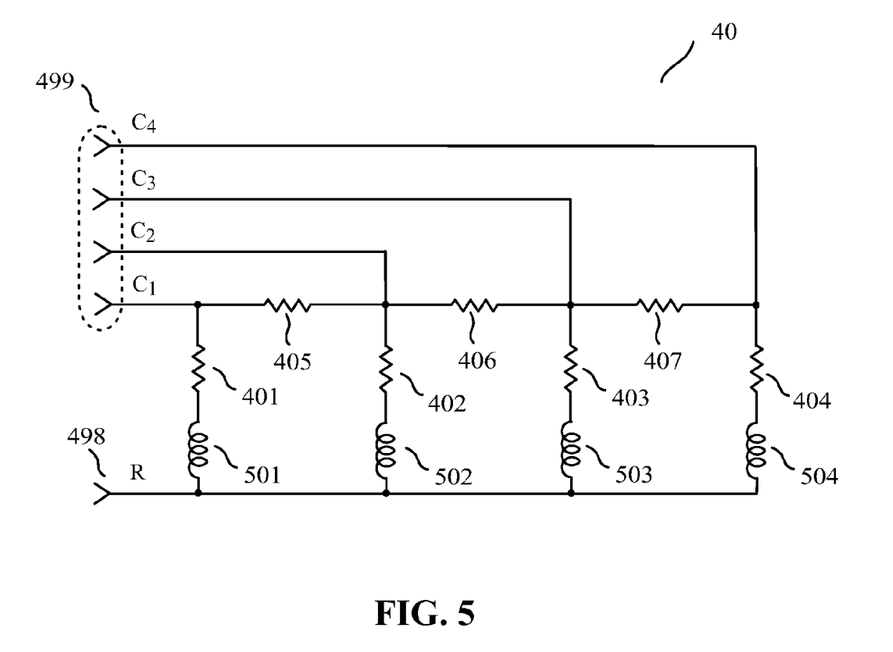
FIG. 5 shows a feedback network which may be used in the first embodiment.

The schematic diagram of FIG. 5 shows a possible feedback network (40) for the circuit of FIG. 4, this feedback network (40) being made of 7 resistors and of 4 windings. This feedback network (40) has n=4 "C" terminals (499) referred to as $C_1$, $C_2$, $C_3$ and $C_4$, and one "R" terminal (498). Four resistors (401) (402) (403) (404) are each connected between one of the "C" terminals (499) and the first terminal of one of the four windings (501) (502) (503) (504) the second terminal of which is connected to the "R" terminal (498). In this feedback network (40), the mutual induction between the windings is negligible, in said known frequency band, but 3 resistors (405) (406) (407) introduce non-diagonal components in $Z_{FB}$. The feedback network (40) of FIG. 2 could also be used in this first embodiment, instead of the feedback network (40) of FIG. 5.

Each active sub-circuit (30) may for instance be of one of the types described in said French patent application number 06/00388 and number 06/05633 and the corresponding international applications. For instance, according to the invention, the multiple-input and multiple-output amplifier may be such that at least one of the active sub-circuits is a second-generation current conveyor, this active sub-circuit for instance having connections (not shown in FIG. 4) to the reference terminal and to sources of electrical power providing the voltages of +5 V and −5V. For instance, according to the invention, the multiple-input and multiple-output amplifier may be such that each active sub-circuit comprises an internal feedback loop.

Figure 6:
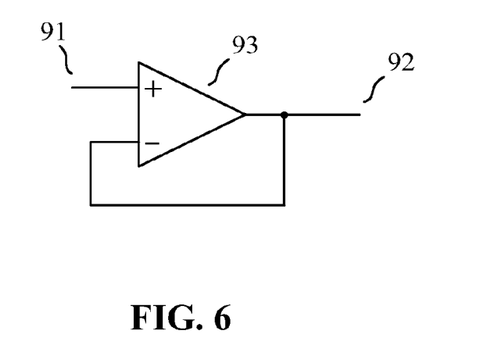
FIG. 6 shows a first example of common terminal amplifier, which may be used in the first embodiment.

A first example of common terminal amplifier (9) which may be used in this first embodiment is shown in FIG. 6, in which a high-speed operational amplifier (93) is used in a voltage follower circuit, the input terminal (91) of the common terminal amplifier being connected to the positive input terminal of the high-speed operational amplifier (93), the output terminal (92) of the common terminal amplifier being connected to the output terminal and to the negative input terminal of the high-speed operational amplifier (93).

Figure 7:
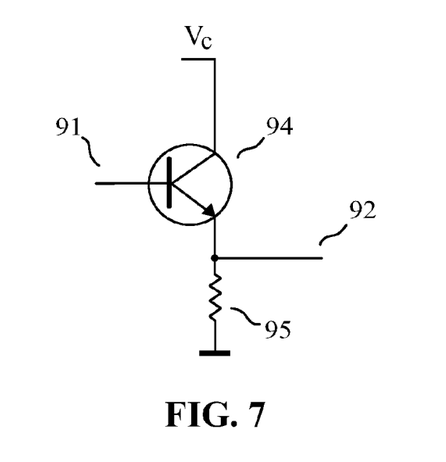
FIG. 7 shows a second example of common terminal amplifier, which may be used in the first embodiment.

A second example of common terminal amplifier (9) which may be used in this first embodiment is shown in FIG. 7, in which a bipolar transistor (94) and a resistor (95) are used in a common collector circuit (i.e. emitter follower circuit), the input terminal (91) of the common terminal amplifier being connected to the base of the transistor (94), the output terminal (92) of the common terminal amplifier being connected to the emitter of the transistor (94) and to a terminal of the resistor (95). The specialist understands that it would be advantageous to replace the resistor (95) with a current source delivering a bias current. The specialist understands that such an ideal current source may be realized with real components, for instance using a current mirror.

Other types of amplifier could be used as common terminal amplifier (9) in this first embodiment, including structures using several amplifiers, such as the ones described in the U.S. Pat. No. 7,099,395 entitled "Reducing coupled noise in pseudo-differential signaling".

The common terminal amplifiers shown in FIG. 6 and FIG. 7 have, in the known frequency band, a small-signal voltage gain close to 1. The common terminal amplifier shown in FIG. 6 may be more accurate than the one shown in FIG. 7, for instance at frequencies lower than 300 MHz. The common terminal amplifier shown in FIG. 7 may typically be used at much higher frequencies than the one shown in FIG. 6.

It is important to note that, for the multiple-input and multiple-output amplifier shown in FIG. 4, if the output impedance $z_{CO}$ of the common terminal amplifier (9) is not negligible, this output impedance may contribute to the series-series feedback for the signals applied to the input terminals (10) (11) (12) (13) (14). In this case, the specialist understands that the impedance matrix $Z_{TFB}$ which determines the series-series feedback is $$Z_{TFB} = Z_{FB} + \begin{pmatrix} z_{CO} & z_{CO} & z_{CO} & z_{CO} \\ z_{CO} & z_{CO} & z_{CO} & z_{CO} \\ z_{CO} & z_{CO} & z_{CO} & z_{CO} \\ z_{CO} & z_{CO} & z_{CO} & z_{CO} \end{pmatrix} \quad (15)$$

In said known frequency band, the absolute value $|z_{CO}|$ of the output impedance $z_{CO}$ of the common terminal amplifier (9) used in this first embodiment is much smaller than the absolute values of all components of the matrix $Z_{FB}$. In this manner, the matrix $Z_{TFB}$ is mainly determined by the matrix $Z_{FB}$. Consequently, the matrix $Z_{TFB}$ does not depend much on temperature.

As shown in this first embodiment, the multiple-input and multiple-output amplifier of the invention may be such that the number n of signal output terminals is greater than or equal to four.

Second Embodiment

Best Mode

Figure 8:
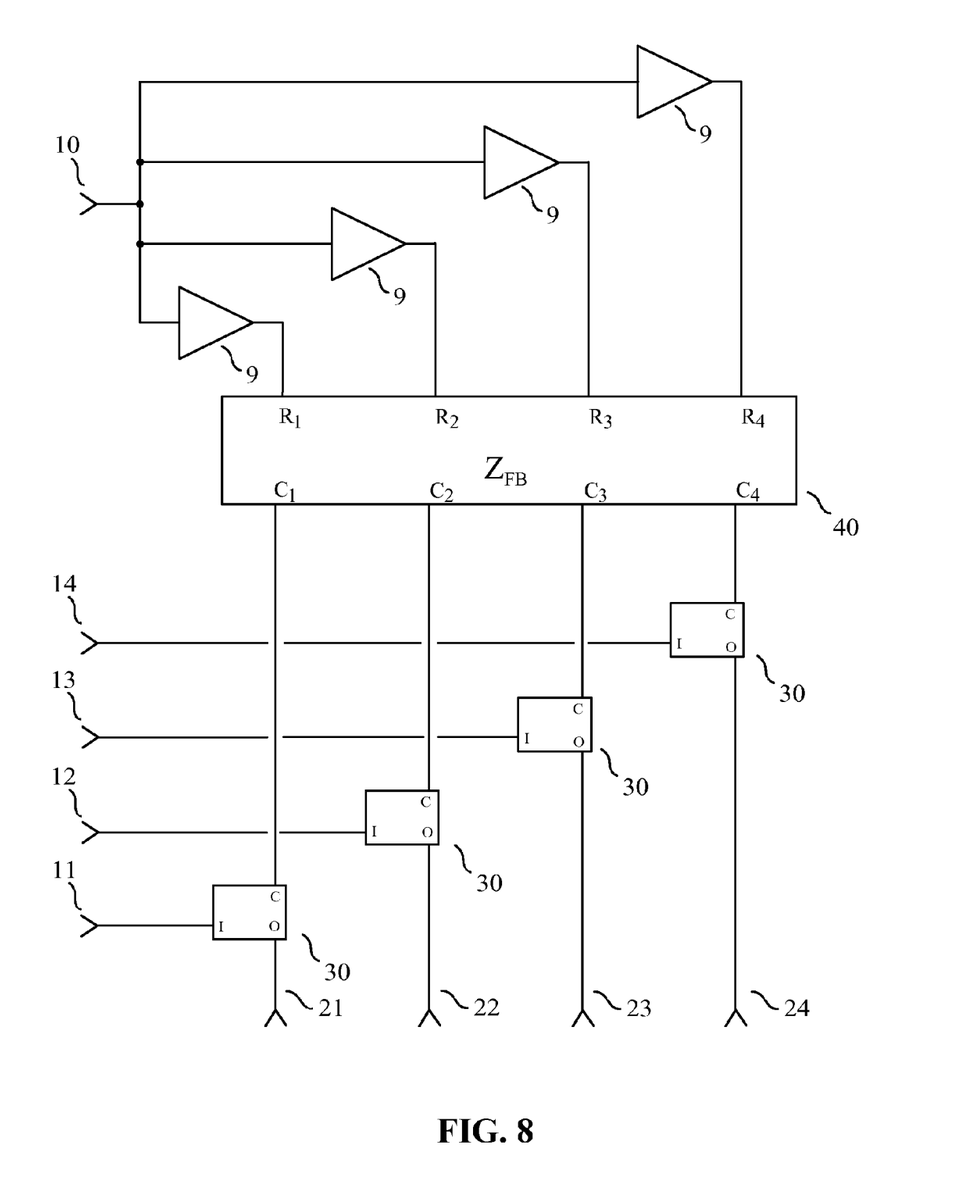
FIG. 8 shows a second embodiment of the invention, for n=4.

As a second embodiment of a device of the invention, given by way of non-limiting example and best mode of carrying out the invention, we have represented in FIG. 8 a "multiple-input and multiple-output amplifier having pseudo-differential inputs" of the invention, comprising one common input terminal (10), n=4 signal input terminals (11) (12) (13) (14), n=4 signal output terminals (21) (22) (23) (24), 4 common terminal amplifiers (9), 4 active sub-circuits (30) and a feedback network (40). Each active sub-circuit (30) has a sub-circuit input terminal connected to one of the signal input terminals (11) (12) (13) (14), a sub-circuit output terminal connected to one of the signal output terminals (21) (22) (23) (24), and a sub-circuit common terminal. Each active sub-circuit (30) is such that the current flowing out of the sub-circuit common terminal and the current flowing into the sub-circuit output terminal depend on the voltage between the sub-circuit input terminal and the sub-circuit common terminal. The feedback network (40) has n=4 "C" terminals and 4

"R" terminals. Said "C" terminals are referred to as $C_1, C_2, C_3$ and $C_4$. Each of said "C" terminals of the feedback network (40) is coupled to the sub-circuit common terminal of one of said active sub-circuits (30). Said "R" terminals are referred to as $R_1, R_2, R_3$ and $R_4$. Each of said "R" terminals of the feedback network (40) is coupled to the output terminal of one of said common terminal amplifiers (9). The input terminal of each of said common terminal amplifiers (9) is coupled to said common input terminal (10).

Let us consider another circuit in which said "R" terminals of the feedback network (40) would be connected to the reference terminal. The feedback network (40) is such that, in this other circuit, the impedance matrix of the "C" terminals of the feedback network (40) with respect to the reference terminal is defined, in a known frequency band. This matrix is the above-defined impedance matrix $Z_{FB}$ of the "C" terminals of the feedback network with respect to the "R" terminals connected the one to the other, which is a matrix of size n×n. Moreover, the feedback network (40) is such that, at any frequency in said known frequency band, $Z_{FB}$ is a non-diagonal matrix. Consequently, the specialist understands that, in said known frequency band, the output signals are not linear combinations of the input signals such that each of said linear combinations comprises only one non zero coefficient, that is to say linear combinations which could be obtained using n single-input and single-output amplifiers.

Figure 9:
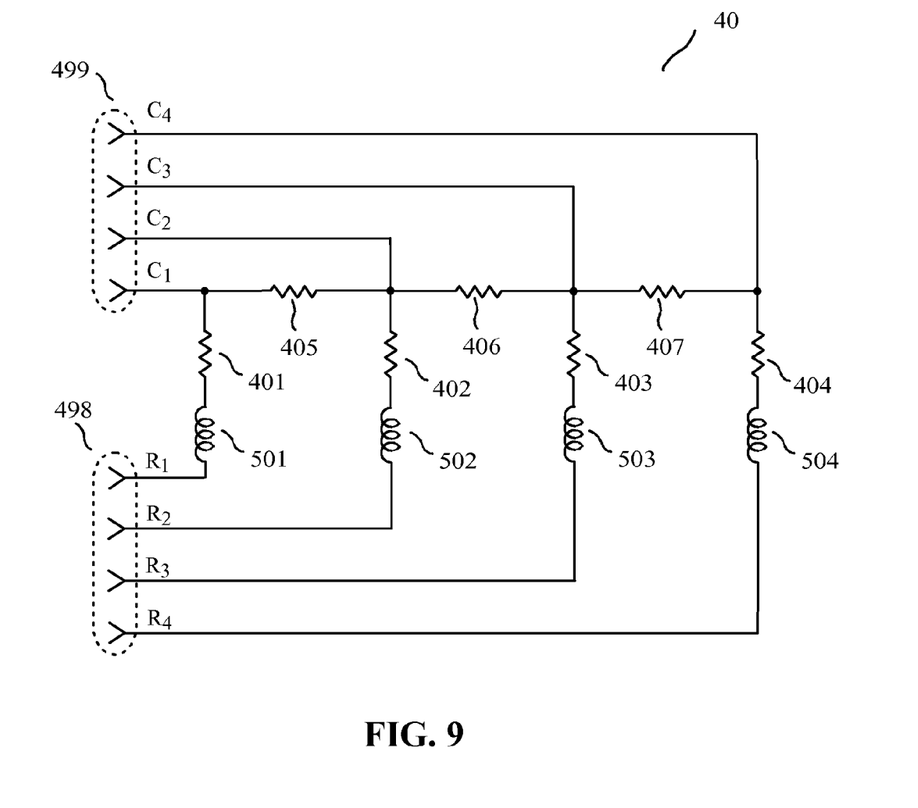
FIG. 9 shows a feedback network used in the second embodiment.

The schematic diagram of FIG. 9 shows a feedback network (40) for the circuit of FIG. 8, this feedback network (40) being made of 7 resistors and of 4 windings. This feedback network (40) has n=4 "C" terminals (499) referred to as $C_1$, $C_2, C_3$ and $C_4$, and 4 "R" terminals (498) referred to as $R_1, R_2$, $R_3$ and $R_4$. Four resistors (401) (402) (403) (404) are each connected between one of the "C" terminals (499) and the first terminal of one of the four windings (501) (502) (503) (504) the second terminal of which is connected to one of the "R" terminals (498). In this feedback network (40), the mutual induction between the windings is negligible, in said known frequency band, but 3 resistors (405) (406) (407) introduce non-diagonal components in $Z_{FB}$.

Each active sub-circuit (30) may for instance be of one of the types described in said French patent applications number 06/00388 and number 06/05633 and the corresponding international applications. The common terminal amplifiers (9) have, in the known frequency band, a small-signal voltage gain close to one.

It is important to note that, for the multiple-input and multiple-output amplifier shown in FIG. 8, if the output impedances of the common terminal amplifiers (9) are not negligible, these output impedances may contribute to the series-series feedback for the signals applied to the input terminals (10) (11) (12) (13) (14).

Third Embodiment

Figure 10:
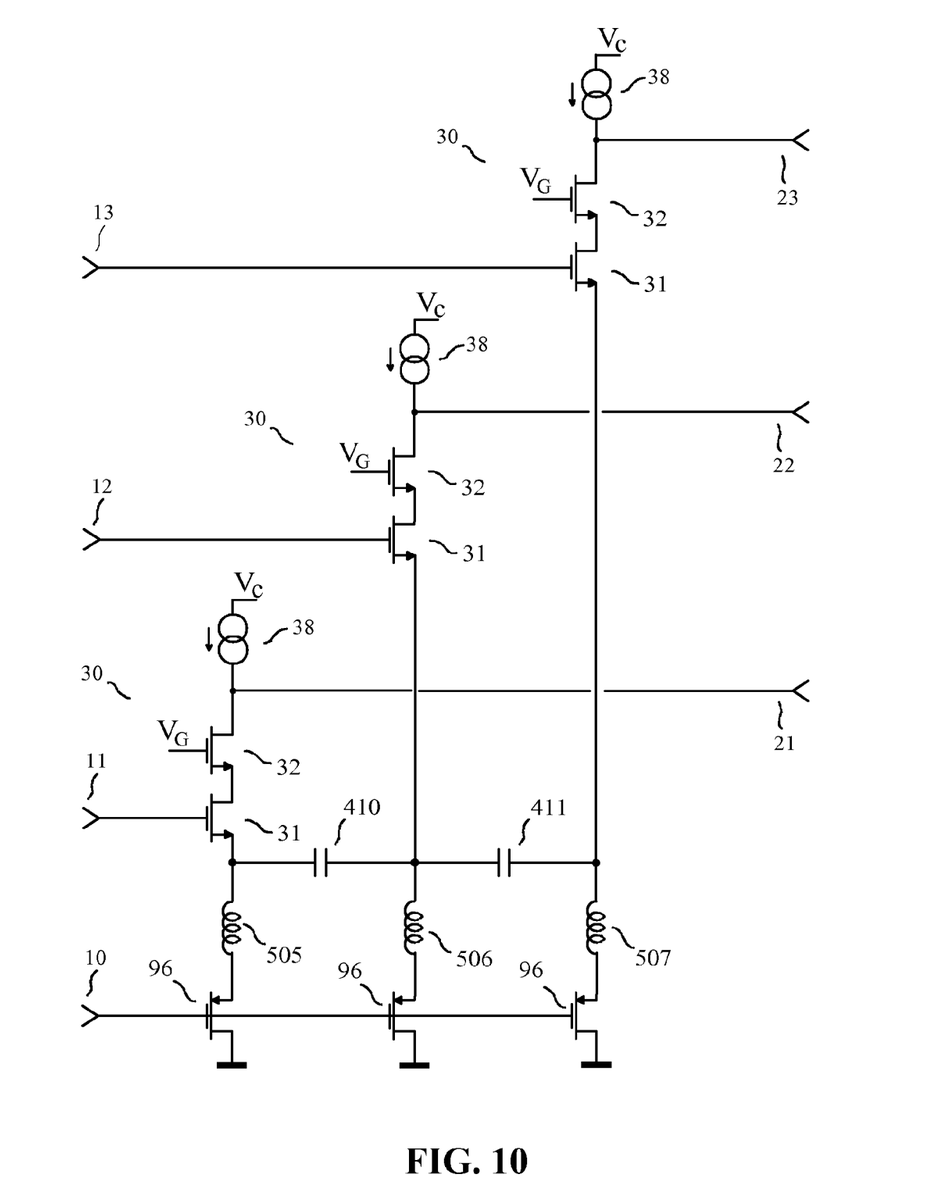
FIG. 10 shows a third embodiment of the invention, for n=3.

The third embodiment of a device of the invention, given by way of non-limiting example, corresponds to the multiple-input and multiple-output amplifier having pseudo-differential inputs represented in FIG. 10. This multiple-input and multiple-output amplifier comprises one common input terminal (10), n=3 signal input terminals (11) (12) (13), n=3 signal output terminals (21) (22) (23), 3 common terminal amplifiers, 3 active sub-circuits (30) and a feedback network.

In FIG. 10, each of the 3 common terminal amplifiers comprises one MOSFET (96) used in a common drain circuit (i.e. a source follower circuit). An appropriate biasing of the common input terminal (10) must be provided by external circuits not shown in FIG. 10.

In FIG. 10, each of the 3 active sub-circuits (30) comprises a first MOSFET (31) and a second MOSFET (32) in the cascode configuration well known to specialists. The 3 current sources (38) provide the biasing of the sub-circuit output terminals. The bias voltage $V_G$ for the gates of the second MOSFETs (32) must be provided by external circuits not shown in FIG. 10. An appropriate biasing of the signal input terminals (11) (12) (13) must be provided by external circuits not shown in FIG. 10.

The feedback network is made of two capacitors (410) (411) and of three windings (505) (506) (507) presenting a non-negligible mutual induction between them. We note that, in this third embodiment, the impedance matrix $Z_{FB}$ of the "C" terminals of the feedback network with respect to the "R" terminals connected the one to the other is non-diagonal only at frequencies greater than 0 Hz.

The active sub-circuits and the feedback network are proportioned in such a way that the negative series-series feedback produces a short-circuit transfer admittance matrix $Y_T$ approximating a given admittance matrix $Y_G$, in a known frequency band, this known frequency band being the 1 MHz to 5 GHz band in this third embodiment.

As shown in this third embodiment, the multiple-input and multiple-output amplifier of the invention may be such that the number n of signal output terminals is greater than or equal to three.

Fourth Embodiment

Figure 11:
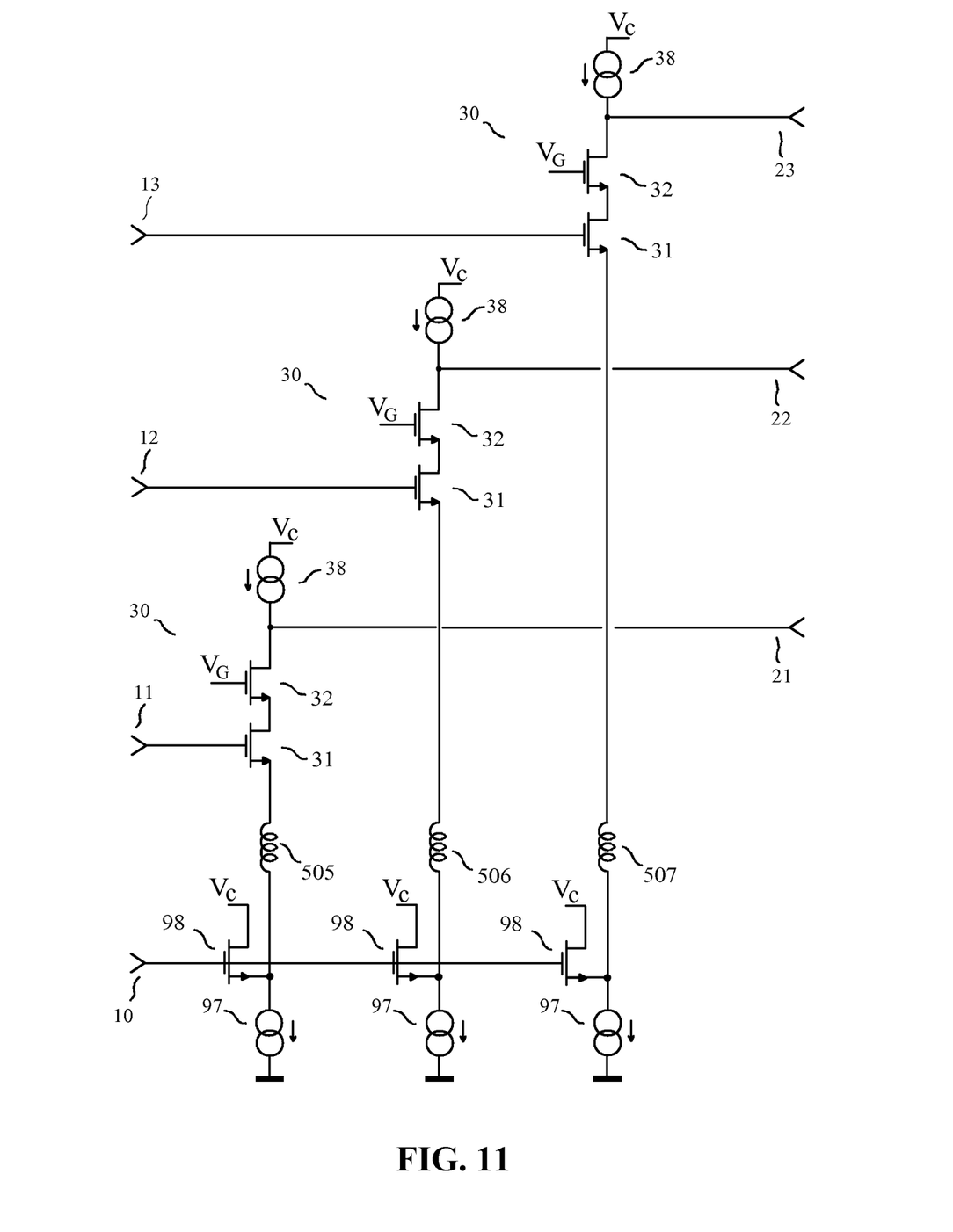
FIG. 11 shows a fourth embodiment of the invention, for n=3.

The fourth embodiment of a device of the invention, given by way of non-limiting example, corresponds to the multiple-input and multiple-output amplifier having pseudo-differential inputs represented in FIG. 11. This multiple-input and multiple-output amplifier comprises one common input terminal (10), n=3 signal input terminals (11) (12) (13), n=3 signal output terminals (21) (22) (23), 3 common terminal amplifiers, 3 active sub-circuits (30) and a feedback network.

In FIG. 11, each of the 3 common terminal amplifiers comprises one current source (97) and one MOSFET (98) used in a common drain circuit. An appropriate biasing of the common input terminal (10) must be provided by external circuits not shown in FIG. 11.

In FIG. 11, each of the 3 active sub-circuits (30) comprises a first MOSFET (31) and a second MOSFET (32) in the cascode configuration. The 3 current sources (38) provide the biasing of the sub-circuit output terminals. The bias voltage $V_G$ for the gates of the second MOSFETs (32) must be provided by external circuits not shown in FIG. 11. An appropriate biasing of the signal input terminals (11) (12) (13) must be provided by external circuits not shown in FIG. 11.

The active sub-circuits and the feedback network are proportioned in such a way that the negative feedback produces a short-circuit transfer admittance matrix $Y_T$ approximating a given admittance matrix $Y_G$ in a known frequency band, this known frequency band being the 1850 MHz to 1910 MHz band in this fourth embodiment.

The feedback network is made of three windings (505) (506) (507) presenting a non-negligible mutual inductance between them. We shall use $L_1$, $L_2$ and $L_3$ to denote the inductances of the windings (505), (506) and (507), respectively. We shall use $R_1$, $R_2$ and $R_3$ to denote the resistances of the windings (505), (506) and (507), respectively. Three mutual inductances $M_{ij}$ between these windings must be taken into account. The impedance matrix $Z_{FB}$ of the "C" terminals of the feedback network with respect to the "R" terminals connected the one to the other is therefore:

$$Z_{FB} = \begin{pmatrix} R_1 + j\omega L_1 & j\omega M_{12} & j\omega M_{13} \\ j\omega M_{12} & R_2 + j\omega L_2 & j\omega M_{23} \\ j\omega M_{13} & j\omega M_{23} & R_3 + j\omega L_3 \end{pmatrix} \quad (16)$$

Consequently, in this fourth embodiment, the matrix $Z_{FB}$ is non-diagonal only at frequencies greater than 0 Hz. We shall use $z_{CO\,1}$, $z_{CO\,2}$ and $z_{CO\,3}$ to denote the output impedances of the common terminal amplifiers connected to the windings (505), (506) and (507), respectively. The specialist understands that the impedance matrix $Z_{TFB}$ which determines the series-series feedback is $$Z_{TFB} = Z_{FB} + \begin{pmatrix} z_{CO1} & 0 & 0 \\ 0 & z_{CO2} & 0 \\ 0 & 0 & z_{CO3} \end{pmatrix} \quad (17)$$

In said known frequency band, the absolute value $|z_{CO\,1}|$, $|z_{CO\,2}|$ or $|z_{CO\,3}|$ of the output impedance of any one of said common terminal amplifiers used in the fourth embodiment is much smaller than the absolute values of all diagonal components of the impedance matrix $Z_{FB}$ of the "C" terminals of the feedback network with respect to the "R" terminals connected the one to the other. In this manner, the matrix $Z_{TFB}$ is mainly determined by the matrix $Z_{FB}$, and the matrix $Z_{TFB}$ does not depend much on temperature.

We note that the equation (17) giving $Z_{TFB}$ for this fourth embodiment is very different from the equation (15) giving $Z_{TFB}$ for the first embodiment, and that the equations giving $Z_{TFB}$ for the second and the third embodiments would be different from the equations (15) and (17). Moreover, the equations (16) and (17) show that, in this fourth embodiment, all non-diagonal components of the matrices $Z_{FB}$ and $Z_{TFB}$ are attributable to the mutual induction between the different windings of the feedback network.

INDICATIONS ON INDUSTRIAL APPLICATIONS

The invention is particularly suitable for the applications of multiple-input and multiple-output series-series feedback amplifiers.

By way of example, a device of the invention may be applied to an interface circuit for a multiconductor interconnection, in place of a prior art multiple-input and multiple-output series-series feedback amplifier. Such interface circuits using a prior art multiple-input and multiple-output series-series feedback amplifier are for instance described in said French patent applications number 06/00388 and number 06/05633, in the corresponding international applications and in the article of F. Broydé and E. Clavelier entitled "A Simple Method for Transmission with Reduced Crosstalk and Echo", published in the pages 684 to 687 of the proceedings of the 13*th IEEE International Conference on Electronics, Circuits and Systems, ICECS* 2006, which took place in Nice, France, from 10 to 13 Dec. 2006.

By way of example, a device of the invention may be used in place of a pseudo-differential receiving circuit disclosed in said French patent application number 08/03830 and in the corresponding international application.

By way of example, a device of the invention may be used in place of a receiving circuit used in a device disclosed in the French patent application number 08/03876 of 8 Jul. 2008, entitled "Dispositif d'interface multicanal avec circuit de terminaison", corresponding to the international application number PCT/IB2009/051182 of 20 Mar. 2009, entitled "Multichannel interfacing device having a termination circuit".

By way of example, a device of the invention may be applied to a circuit for radio reception using several antennas, instead of a prior art multiple-input and multiple-output series-series feedback amplifier. Such circuits for radio reception using a prior art multiple-input and multiple-output series-series feedback amplifier are for instance described in French patent application number 06/06502 of 18 Jul. 2006 entitled "Procédé et dispositif pour la réception radioélectrique utilisant une pluralité d'antennes", corresponding to the international application number PCT/IB2007/001589 of 5 Jun. 2007 (WO 2008/010035), entitled "Method and device for radio reception using a plurality of antennas", and in the article of F. Broydé and E. Clavelier entitled "Multiple-input-port and multiple-output-port amplifier for wireless receivers", published in the proceedings of the *SAME* 2007 *Forum*, which took place in Sophia-Antipolis, France, from 3 to 4 Oct. 2007.

In these types of application, it is for instance possible that the common input terminal is coupled to ground or to a node having a fixed voltage with respect to ground, at the point where the input signals of the multiple-input and multiple-output amplifier of the invention are taken from a circuit.

A device of the invention comprising pseudo-differential inputs, this device provides a good protection against the noise produced by unwanted electromagnetic couplings, contrary to prior art multiple-input and multiple-output series-series feedback amplifiers using single-ended inputs. Compared to the prior art solution shown in FIG. 3, the device of the invention comprises one or more common terminal amplifiers instead of n differential amplifiers. If we consider that the common terminal amplifier or the common terminal amplifiers used in the invention may be built such that they are less noisy and expensive than differential amplifiers leading to equivalent performances, we conclude that the invention is suitable for reducing costs and improving performances.

The invention claimed is:

1. A multiple-input and multiple-output amplifier comprising:
    a common input terminal, n signal input terminals, n signal output terminals and a reference terminal, where n is an integer greater than or equal to 2;
    at least one common terminal amplifier, each of the common terminal amplifiers being an amplifier comprising an input terminal and an output terminal, the input terminal of each of the common terminal amplifiers being coupled to the common input terminal;
    a number n of active sub-circuits, each of the active sub-circuits having a sub-circuit input terminal, a sub-circuit output terminal and a sub-circuit common terminal, the sub-circuit input terminal being coupled to one of the signal input terminals, the sub-circuit output terminal being coupled to one of the signal output terminals, each of the active sub-circuits being such that the current flowing out of the sub-circuit common terminal and the current flowing into the sub-circuit output terminal depend on the voltage between the sub-circuit input terminal and the sub-circuit common terminal, each of the signal input terminals being coupled to only one sub-circuit input terminal, each of the signal output terminals being coupled to only one sub-circuit output terminal;
    a feedback network having a number n of C terminals and at least one R terminal, each of the C terminals being coupled to the sub-circuit common terminal of one of the active sub-circuits, the output terminal of each of the common terminal amplifiers being coupled to one of the R terminals, the feedback network being such that, in a known frequency band, the impedance matrix of the C terminals with respect to the R terminals connected the one to the other is a non-diagonal n×n matrix.

2. The multiple-input and multiple-output amplifier of claim 1, wherein the number n of signal output terminals is greater than or equal to three.

3. The multiple-input and multiple-output amplifier of claim 1, wherein at least one of the active sub-circuits is such that the current flowing out of the sub-circuit common terminal and the current flowing into the sub-circuit output terminal may be considered as only depending on the voltage between the sub-circuit input terminal and the sub-circuit common terminal.

4. The multiple-input and multiple-output amplifier of claim 1, wherein, in the known frequency band, each of the common terminal amplifiers has a small-signal voltage gain approximately equal to one, the absolute value of the output impedance of any one of the common terminal amplifiers being smaller than the absolute values of all diagonal components of the impedance matrix of the C terminals of the feedback network with respect to the R terminals of the feedback network connected the one to the other.

5. The multiple-input and multiple-output amplifier of claim 1, wherein the impedance matrix of the C terminals of the feedback network with respect to the R terminals of the feedback network connected the one to the other is, in the known frequency band, an invertible matrix.

6. The multiple-input and multiple-output amplifier of claim 5, wherein, in the known frequency band, each of the active sub-circuits has an absolute value of the ratio of the current flowing out of the sub-circuit common terminal to the voltage between the sub-circuit input terminal and the sub-circuit common terminal larger than the absolute values of all components of the inverse of the impedance matrix of the C terminals of the feedback network with respect to the R terminals of the feedback network connected the one to the other.

7. The multiple-input and multiple-output amplifier of claim 1, wherein the feedback network is composed of linear, passive and reciprocal circuit elements.

8. The multiple-input and multiple-output amplifier of claim 1, wherein the feedback network comprises one or more insulated-gate field-effect transistors.

9. The multiple-input and multiple-output amplifier of claim 1, wherein the impedance matrix of the C terminals of the feedback network with respect to the R terminals of the feedback network connected the one to the other can be adjusted by electrical means.

10. The multiple-input and multiple-output amplifier of claim 1, wherein each of said active sub-circuits comprises an internal feedback loop.

* * * * *